United States Patent
Budd et al.

(10) Patent No.: US 10,118,250 B1
(45) Date of Patent: Nov. 6, 2018

(54) IN-SITU LASER BEAM POSITION AND SPOT SIZE SENSOR AND HIGH SPEED SCANNER CALIBRATION, WAFER DEBONDING METHOD

(71) Applicant: International Business Machines Corporation, Armonk, NY (US)

(72) Inventors: Russell Budd, North Salem, NY (US); Robert Polastre, Cold Spring, NY (US); Paul Andry, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/705,521

(22) Filed: Sep. 15, 2017

(51) Int. Cl.
| | |
|---|---|
| H01L 21/00 | (2006.01) |
| H01L 21/02 | (2006.01) |
| H01L 23/544 | (2006.01) |
| B23K 26/402 | (2014.01) |
| B23K 26/04 | (2014.01) |
| H01L 21/683 | (2006.01) |
| H01L 21/67 | (2006.01) |
| G01B 11/26 | (2006.01) |
| B32B 7/12 | (2006.01) |

(52) U.S. Cl.
CPC .......... *B23K 26/043* (2013.01); *B23K 26/402* (2013.01); *G01B 11/26* (2013.01); *H01L 21/02002* (2013.01); *H01L 21/67092* (2013.01); *H01L 21/6835* (2013.01); *B32B 7/12* (2013.01)

(58) Field of Classification Search
CPC .... H01L 21/68; H01L 21/681; G03F 7/70775
See application file for complete search history.

(56) References Cited

U.S. PATENT DOCUMENTS

| | | | |
|---|---|---|---|
| 4,744,663 | A | 5/1988 | Hamashima et al. |
| 4,884,857 | A | 12/1989 | Prakash et al. |
| 6,566,661 | B1 | 5/2003 | Mitchell |
| 7,015,418 | B2 | 3/2006 | Cahill et al. |

(Continued)

FOREIGN PATENT DOCUMENTS

| | | |
|---|---|---|
| JP | 2005526386 A | 9/2005 |
| WO | 02/060636 A1 | 8/2002 |

OTHER PUBLICATIONS

B. Dang, et al., "CMOS Compatible Thin Wafer Processing using Temporary Mechanical Wafer, Adhesive and Laser Release of Thin Chips/Wafers for 3D Integration", 2010 Electronic Components and Technology Conference, Jun. 1-4, 2010, pp. 1393-1398.

(Continued)

*Primary Examiner* — Caridad Everhart
(74) *Attorney, Agent, or Firm* — Scully, Scott, Murphy & Presser, P.C.; Daniel P. Morris, Esq.

(57) ABSTRACT

A method and system for aligning a scan laser beam on a wafer include scanning a scan laser beam across a laser beam sensor along a scan line, picking up a scan laser beam, at a first position, using a first optical slit of the laser beam sensor to generate a first electrical pulse, picking up the scan laser beam, at a second position, using a second optical slit of the laser beam sensor to generate a second electrical pulse, picking up the scan laser beam, at a third position, using a third optical slit of the laser beam sensor to generate a third electrical pulse, and determining a spot size and a position of the laser beam based on the first to third electrical pulses.

13 Claims, 10 Drawing Sheets

(56) References Cited

U.S. PATENT DOCUMENTS

| | | | |
|---|---|---|---|
| 7,280,200 B2 | 10/2007 | Plemmons et al. | |
| 7,397,596 B2 | 7/2008 | Yacoubian | |
| 7,433,052 B2 | 10/2008 | Tobiason et al. | |
| 7,858,911 B2 | 12/2010 | Fairley et al. | |
| 9,269,561 B2 | 2/2016 | Dang et al. | |
| 9,308,715 B2 | 4/2016 | Imai et al. | |
| 9,417,194 B2 | 8/2016 | Wiedmann | |
| 9,576,836 B2 | 2/2017 | Doany et al. | |
| 2004/0031779 A1* | 2/2004 | Cahill | B23K 26/04 219/121.83 |
| 2017/0194185 A1 | 7/2017 | Andry et al. | |

OTHER PUBLICATIONS

P. Andry, et al., "Advanced Wafer Bonding and Laser Debonding", 2014 Electronic Components & Technology Conference, May 27-30, 2014, pp. 883-887.

List of IBM Patents or Patent Applications Treated as Related, dated Nov. 22, 2017, 2 pages.

* cited by examiner

| TIME DIFFERENCE T | DISTANCE D | POSITION P |
|---|---|---|
| T1 | D1 | P1 |
| T2 | D2 | P2 |
| ⋮ | ⋮ | ⋮ |
| TN | DN | PN |

US 10,118,250 B1

IN-SITU LASER BEAM POSITION AND SPOT SIZE SENSOR AND HIGH SPEED SCANNER CALIBRATION, WAFER DEBONDING METHOD

FIELD

The present disclosure relates to a wafer debonding process, and more particularly to a method for sensing and calibrating characteristics of a scan laser beam and a scan magnification for wafer debonding.

BACKGROUND

A laser-assisted wafer debonding is used during a semiconductor device manufacturing process. In order to avoid damages on sensitive circuits formed in a wafer, a scan laser beam (i.e., a scanning laser beam or a scanned laser beam) provided by a laser scanning system should be precisely projected on desired locations on a wafer. However, precise alignment of the scan laser beam to the wafer is challenging since a laser scan pattern may vary due to changes in spot size and position of a laser beam on a wafer, and a scan magnification of a laser scanning system. Thus, a method for sensing and calibrating the spot size and position of the laser beam and the scan magnification of the laser scanning system is needed.

SUMMARY

In an aspect of the present disclosure, a method for aligning a scan laser beam on a wafer is provided. The method includes: scanning, along a laser scan line, a scan laser beam generated from a laser scanning system across at least one laser beam sensor outside the wafer; picking up, at a first position of the laser scan line, the scan laser beam using a first optical slit formed on the at least one laser beam sensor; picking up, at a second position of the laser scan line, the scan laser beam using a second optical slit formed on the at least one laser beam sensor; picking up, at a third position of the laser scan line, the scan laser beam using a third optical slit formed on the at least one laser beam sensor; converting the scan laser beam picked up at the first position to a first electrical pulse; converting the scan laser beam picked up at the second position to a second electrical pulse; converting the scan laser beam picked up at the third position to a third electrical pulse, determining, using at least one processor, a spot size of the scan laser beam based on a laser scan speed and a temporal width of the first electrical pulse; and determining, using at least one processor, a position of the scan laser beam based on a time difference between the second and third electrical pulses. The at least one laser beam is adjacent to one of opposing edges of the wafer. Positions of the second optical slit and the third optical slit relative to the wafer are known to the at least one processor.

In another aspect of the present disclosure, a laser beam sensing system is provided. The laser beam sensing system includes one or more laser beam sensors located outside a wafer and at least one processor. At least one laser beam sensor of the laser beam sensors includes first to third optical slits. The first optical slit is configured to pick up, at a first position of a laser scan line, a scan laser beam generated from a laser scanning system and guide the laser beam to a photodetector. The second optical slit is configured to pick up, at a second position of the laser scan line, the scan laser beam and guide the laser beam to the photodetector. The third optical slit is configured to pick up, at a third position of the laser scan line, the scan laser beam and guide the laser beam to the photodetector. The photodetector is configured to convert the laser beam guided through the first to third optical slits to first to third electrical pulses, respectively. The at least one processor is configured to determine a spot size of the laser beam based on a laser scan speed and a temporal width of the first electrical pulse and determine a position of the scan laser beam based on a time difference between the second and third electrical pulses. The at least one laser beam is adjacent to one of opposing edges of the wafer. Positions of the second optical slit and the third optical slit relative to the wafer are known to the at least one processor.

In still another aspect of the present disclosure, a wafer debonding apparatus is provided. The wafer debonding apparatus includes a laser scanning system configured to provide a scan laser beam and a laser beam sensing system located outside a wafer for aligning the scan laser beam on the wafer. At least one laser beam sensor of the laser beam sensing system includes first to third optical slits. The first optical slit is configured to pick up, at a first position of a laser scan line, a scan laser beam generated from a laser scanning system and guide the laser beam to a photodetector. The second optical slit is configured to pick up, at a second position of the laser scan line, the scan laser beam and guide the laser beam to the photodetector. The third optical slit is configured to pick up, at a third position of the laser scan line, the scan laser beam and guide the laser beam to the photodetector. The photodetector is configured to convert the laser beam guided through the first to third optical slits to first to third electrical pulses, respectively. The at least one processor is configured to determine a spot size of the laser beam based on a laser scan speed and a temporal width of the first electrical pulse and determine a position of the scan laser beam based on a time difference between the second and third electrical pulses. The at least one laser beam is adjacent to one of opposing edges of the wafer. Positions of the second optical slit and the third optical slit relative to the wafer are known to the at least one processor.

DETAILED DESCRIPTION OF THE EMBODIMENTS

Embodiments of the present invention will now be described in detail on the basis of the drawings. However, the following embodiments do not restrict the invention claimed in the claims. Moreover, all combinations of features described in the embodiments are not necessarily mandatory for the architecture of the present invention. Like numbers are assigned to like elements throughout the description of the embodiments of the present invention. It will be understood that, although the terms first, second, third, etc. may be used herein to describe various elements. However, locations of these elements or orders where the elements are arranged should not be limited by these terms. Instead, these terms are only used to distinguish one element from another element.

A laser beam sensing system or method according to an embodiment of the present disclosure provides efficient and accurate determinations on the spot size and the position of a scan laser beam, which will be irradiated on a surface of an object (e.g., wafer) under process and a scan magnification of a laser scanning system generating the scan laser beam. Thus, the scan laser beam may be calibrated based on determined results of the laser beam's spot size and position, and the scan magnification, and the calibrated laser beam may be used to release the object from another (e.g., substrate, wafer handler). For example, if the laser beam sensing system is used in a semiconductor process, the releasing of the object from another may refer to debonding a wafer from, e.g., a substrate, a wafer handler, etc. Further, in the present disclosure, the term "debonding a wafer" or "wafer debonding" may include releasing or ablating adhesives attached on a wafer including entire area or edges.

The term "match" between two values as used herein does not necessarily only refer to an "exact match" where one is exactly equal to another but can also refer to a "partial match" where one is similar to another within a predetermined acceptable range.

Figure 1:
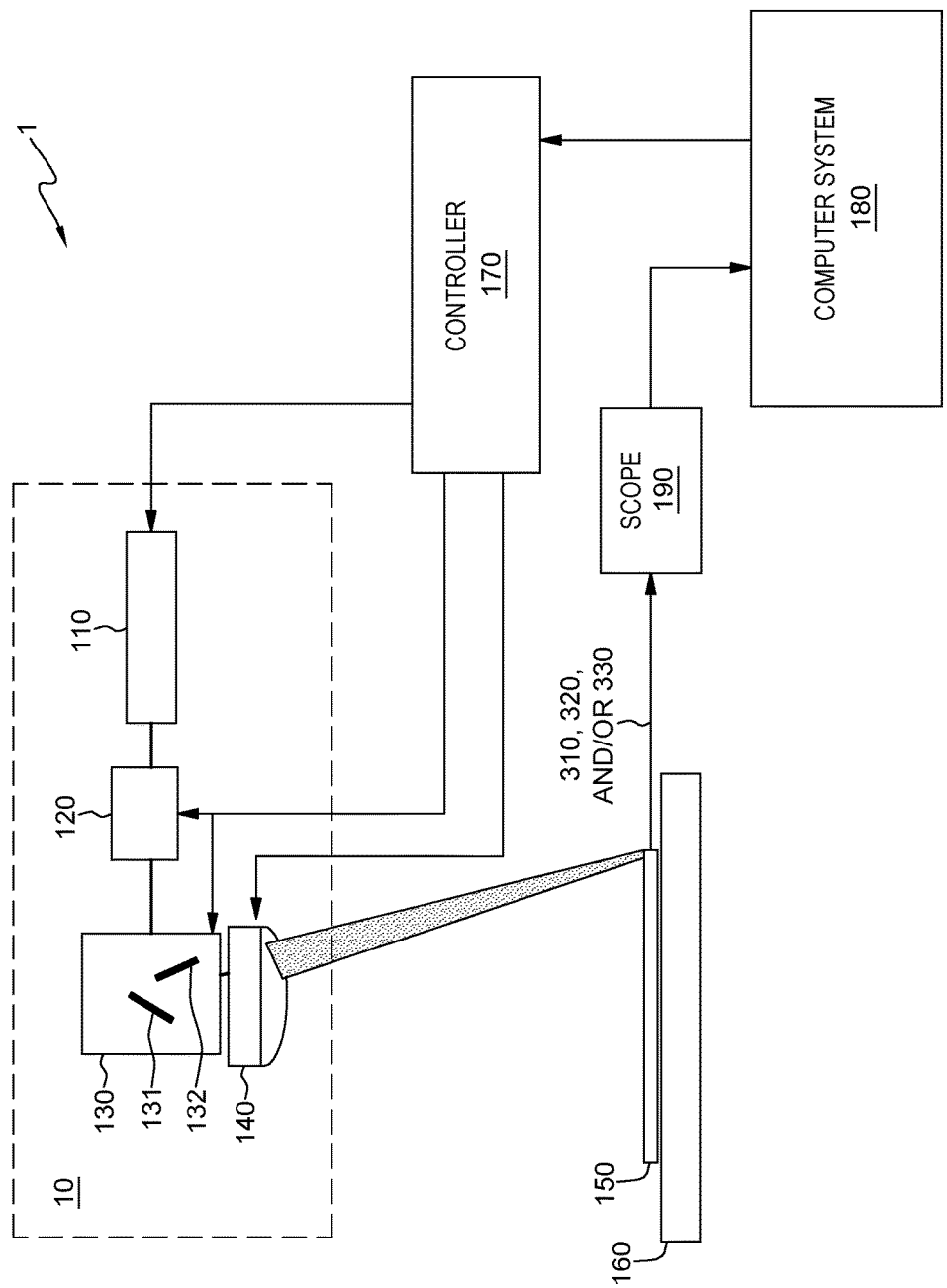
FIG. 1 depicts a block diagram of an example apparatus for performing a wafer debonding process according to an embodiment of the present disclosure.

FIG. 1 depicts a block diagram of an example apparatus 1 for performing a wafer debonding process according to an embodiment of the present disclosure.

In some embodiments, as depicted in FIG. 1, a wafer holder 160 and a wafer 150 remain stationary, for example, on a stage (not shown). A scan laser beam may be generated by a laser scanning system 10 focused, and moved over the wafer 150 to ablate adhesives attached on the wafer 150. The laser scanning system 10 may include a laser source 110, a beam shaper 120, an optical scanner 130, and a scan lens 140. The laser source 110 may generate and provide a laser beam to the beam shaper 120 which is configured to adjust a beam size of the laser beam. The output beam of the beam shaper 120 may be directed to the optical scanner 130. The optical scanner 130 may be configured to adjust the position of the laser beam that will be projected on the surface of the wafer 150 so as to scan the laser beam across the surface of the wafer 150 with a scan speed of, e.g., 1 mm/sec. The position of the laser beam may be adjusted along x and/or y axes on the surface of the wafer 150. In one embodiment, the optical scanner 130 may include rotational mirrors 131 and 132 (e.g., galvo mirrors) each of which is rotated such that the laser beam is scanned on a desired position on the wafer 150. The scan lens (e.g., f-theta lens) 140 with a focal length (e.g., 800 mm) may receive the rotating laser beam from the optical scanner 130 and adjust the laser beam to be focused on the surface of the wafer 150 with a desired laser beam spot size.

In one embodiment, the laser scanning system 10 may generate one or more laser scan patterns along which a laser beam is scanned. With one laser scan pattern, the entire region of the wafer 150 are scanned to ablate a majority of adhesives, and with another scan pattern, edge portions of the wafer 150 are scanned for wafer edge-clean up process.

The operations of the laser source 110, the beam shaper 120, the optical scanner 130, and the scan lens 140 may be controlled using a controller 170. In one embodiment, the controller 170 may perform the controls using a processor included therein. In one embodiment, the controller 170 may be interfaced with a computer system 180, and the computer system 180 may include a memory (not shown) and a processor (not shown) coupled to the memory, so that the processor may execute instructions stored in the memory to interface the controller 170 for controlling the operations of the laser source 110, the beam shaper 120, the optical scanner 130, and the scan lens 140. Further, the computer system 180 may perform various calculations to determine the laser beam's spot size and position, and the scan magnification, which will be described later in detail.

In other embodiments, the stage upon which the wafer holder 160 and the wafer 150 are mounted may be movable (while a laser beam provided by the laser scanning system 10 may remain stationary) for scanning a laser beam across the wafer 150. To this end, the controller 170 can control the movements of the stage; in this particular embodiment, the optical scanner 130 may be omitted in the laser scanning system 10.

In one embodiment, the laser source 110 may generate a pulsed laser beam such as a ultra-violet (UV) laser beam of e.g., 335 nm, an infrared (IR) laser beam ranging from, e.g., 1.12 μm to 1.5 μm, etc. For example, the pulsed laser beam may have a repetition rate of, e.g., 50 kHz and an optical power of, e.g., 6 Watts, which can be controlled by the controller 170.

Figure 2:
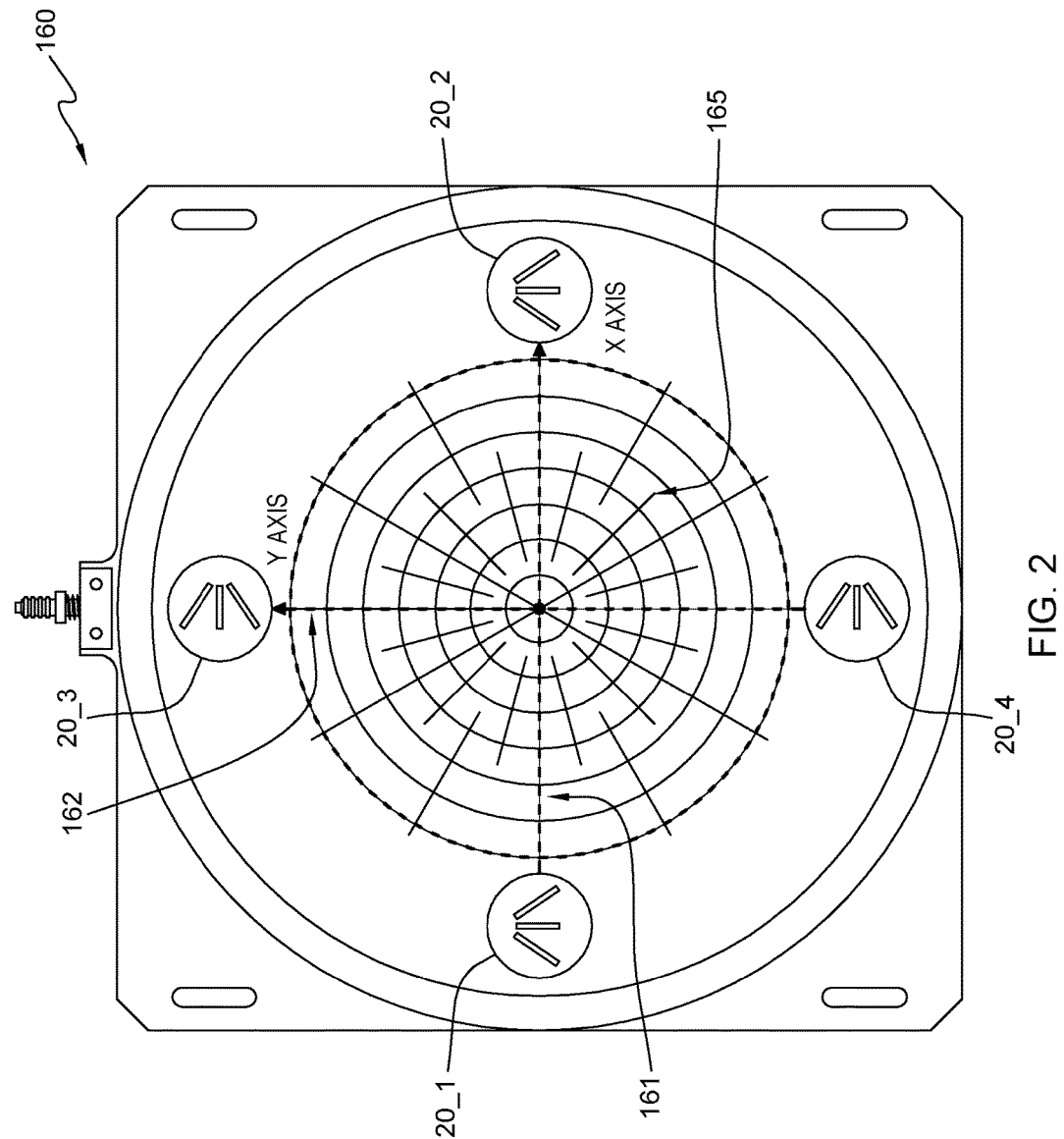
FIG. 2 depicts a plurality of laser beam sensors formed in a wafer holder according to an embodiment of the present disclosure.

FIG. 2 depicts a plurality of laser beam sensors 20_1 to 20_4 formed in a wafer holder 160 according to an embodiment of the present disclosure.

As depicted in the example of FIG. 2, the wafer holder 160 may include: a wafer-set region 165 where the wafer 150 will be located for debonding process; and an outer region of the wafer-set region 165. The laser beam sensors 20_1 to 20_4 may be formed around the perimeter of the wafer-set region 165. For illustrative purpose only, the laser beam sensors 20_1 and 20_2 may be formed adjacent to two opposing edges on a line 161 (e.g., x axis) that crosses the center of the wafer-set region 165 (or the wafer 150), and the laser beam sensor 20_3 and 20_4 may be formed adjacent to another two opposing edges on a line 162 (e.g., y axis) that crosses the center of the wafer-set region 165 (or the wafer 150), as shown in FIG. 2. The laser beam sensors 20_1 and 20_2 on the line 161 may be located adjacent to both opposing edges of the wafer-set region 165 and used to sense the characteristics of a laser beam scanned along the line 161 or one or more scan lines substantially parallel to the line 161. In addition, the laser beam sensors 20_3 and 20_4 on the line 162 may be located adjacent to both opposing edges of the wafer-set region 165 and used to sense the characteristics of a scan laser beam scanned along the line 162 or one or more scan lines substantially parallel to the line 162. However, embodiments of the present disclosure are not limited to what is illustrated in FIG. 2. For example, one or more additional laser beam sensors can be formed around the perimeter of the wafer-set region 165.

Figure 3B:
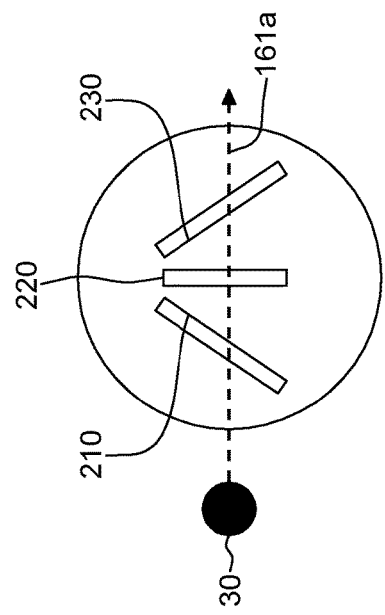
FIGS. 3B to 3D are diagrams illustrating configuration and operation of the laser beam sensor of the example laser beam sensor of FIG. 3A according to an embodiment of the present disclosure.
Figure 3D:
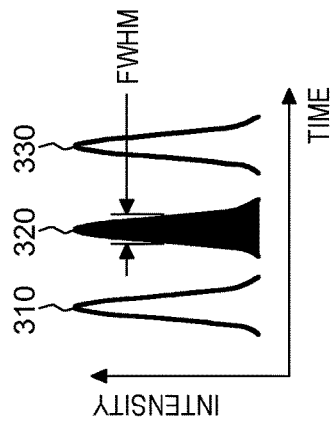
Figure 3A:
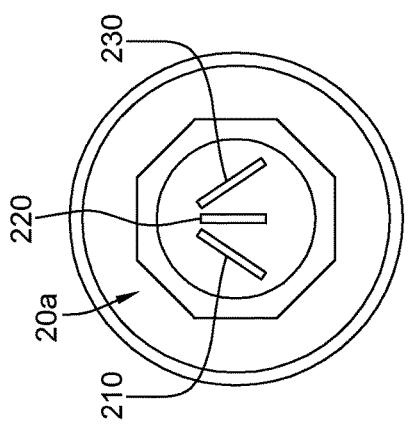
FIG. 3A is a top view of an example laser beam sensor according to an embodiment of the present disclosure.
Figure 3C:
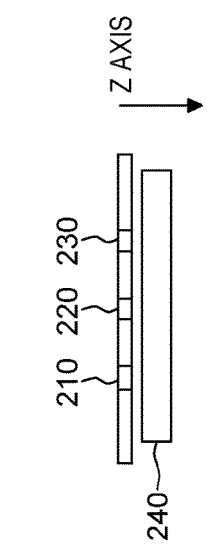

FIG. 3A is a top view of an example laser beam sensor 20a according to an embodiment of the present disclosure. FIGS. 3B to 3D are diagrams illustrating configuration and operation of the example laser beam sensor 20a of FIG. 3A according to an embodiment of the present disclosure.

As depicted in the example of FIGS. 3A and 3B, the laser beam sensor 20a may include first to third optical slits 210 to 230 and a photodetector 240. For illustrative purpose only, the photo detector 240 may be located under the optical slits 210 to 230.

Referring to FIG. 3B, the first to third optical slits 210 to 230 may be arranged apart along a laser scan line 161a which corresponds to e.g., the line 161 or 162 of FIG. 2. Although described later, the configuration of the laser beam sensor 20a is not limited to what is illustrated in FIGS. 3A to 3D. Each of the first to third optical slits 210 to 230 may be formed on a same plane as the top surface of the wafer 150 or the wafer-set region 165 to which the scan laser beam will be irradiated. For example, the top surface of each of the optical slits 210 to 230 may have substantially the same height in a z axis as the top surface of the wafer 150, as exemplary shown in FIG. 3C. In addition, each of the optical slits 210 to 230 may have a flat top surface in the z axis. Referring now to FIG. 3B, the second optical slit 220 may be formed between the first and third optical slits 210 and 230. The second optical slit 220 may extend in a longitudinal direction (e.g., vertical direction) substantially perpendicular to the laser scan line 161a. In one embodiment, the first and third optical slits 210 and 230 may extend to form a "V-shape" with respect to the longitudinal direction of the second optical slit 220; in this particular embodiment, the first optical slit 210 may extend such that its longitudinal direction is inclined toward an opposite direction to the third optical slit 230 with respect to the longitudinal direction of the second optical slit 220. For example, the first optical slit 210 may be inclined by a first angle from the laser scan line 161a along the counter-clock wise direction, and the third optical slit 230 may be inclined by a second angle from the laser scan line 161a along the clock wise direction. In some aspects, the first and second angles may be substantially the same (e.g., 45 degrees) as each other; for example, the first and third optical slits 210 and 230 may be symmetrical with respect to the longitudinal direction of the second optical slit 220. In some embodiments, the first angle and the second angle can be arbitrary values different from each other.

In one embodiment, the width of each optical slit 210 to 230 may be an order of an intended spot size (e.g., 0.2 mm) of a laser beam such that multiple spots of the laser beam may be recorded (or picked up) and averaged as the laser beam crosses each optical slit.

In one embodiment, each of the optical slits 210 to 230 may be formed by plating chrome on glass reticles corresponding to respective shapes of the optical slits 210 to 230.

As shown in FIG. 3B, as a scan laser beam 30 is scanned over the laser beam sensor 20a along the laser scan line 161a, the scan laser beam 30 may be picked up by the first optical slit 210 at a first position on the laser scan line 161a and guided to the photodetector 240. Similarly, the scan laser beam 30 may be picked up by the second optical slit 220 at a second position on the laser scan line 161a and guided to the photodetector 240. In addition, the scan laser beam 30 may be picked up by the third optical slit 230 at a third position on the laser scan line 161a and guided to the photodetector 240. The first position may also correspond to a position of the first optical slit 210 where the laser beam 30 is picked up. The second position may correspond to a position of the second optical slit 220 where the laser beam 30 is picked up. The third position may correspond to a position of the third optical slit 230 where the laser beam 30 is picked up. The photodetector 240 may receive the respective laser beams 30 guided, respectively, through the first to third optical slits 210 to 230 and convert each of the laser beams 30 to a corresponding electrical pulse. For example, the photodetector 240 may convert the laser beam picked up by the first optical slit 210 to a first electrical pulse 310, the laser beam picked up by the second optical slit 220 to a second electrical pulse 320, and the laser beam 30 picked up by the third optical slit 230 to a third electrical pulse 330. Shown in FIG. 3D are examples of the first and third electrical pulses 310 to 330. The first to third electrical pulses 310 to 330 may be measured by a measurement setup 190 (e.g., a scope) to be provided to the computer system 180, so that the computer system 180 may calculate the laser beam's spot size and the position, and the scan magnification based on intensity profiles of the provided first to third electrical pulses 310 to 330.

In one embodiment, the laser beam's spot size may be determined using the intensity profile of the second electrical pulse 320 detected through the second optical slit 220. For example, the laser beam's spot size may be determined based on a temporal width (e.g., a full-width half maximum (FWHM)) of the second electrical pulse 320). In one embodiment, the computer system 180 may calculate the spot size Ws of the scan laser beam 30 by calculating Equation 1 given by:

$$\text{Spot size } Ws = \text{Scan speed } SP \times \text{Temporal width } Tw \quad \text{(Equation 1)}$$

For example, if the laser beam 30 moves along the laser scan line 161a with a scan speed of 1 mm/sec and the FWHM value of the laser beam 30 is measured as 0.2 msec according to the method described above, the spot size Ws may be calculated to be 0.2 mm using Equation 1.

It should be noted that at least the scan laser beam's spot size, power, repetition rate, and scanning speed are all needed to be known to control the delivered fluence to a wafer ablation layer. Of these, the repetition rate is an internal parameter of the laser source, the scanning speed is selectable, and the laser beam's power is selectable and/or measureable with ease, thus they are all known. However, the laser beam's spot size may vary and may be adjustable according to a configuration of optics that the laser beam travels. As the spot size can be determined by the laser beam sensor according to an embodiment, all the required parameters of the laser beam can be known so as to determine a net fluence for debonding the wafer ablation layer from a wafer and maximize a debonding speed.

Figure 4:
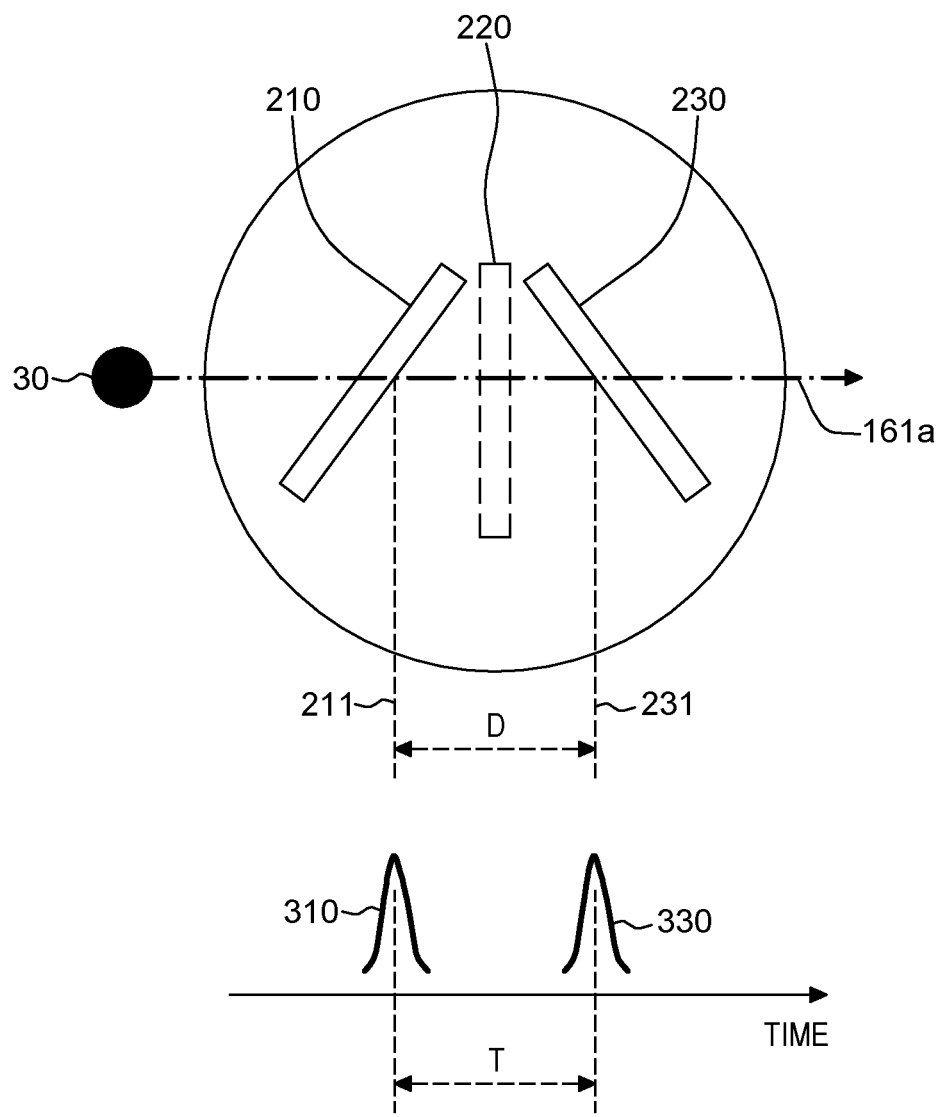
FIG. 4 is a schematic diagram illustrating a method for determining a laser beam' position using two optical slits arranged apart along a laser scan line according to an embodiment of the present disclosure.

FIG. 4 is a schematic diagram illustrating a method for determining a laser beam' position using two optical slits 210 and 230 arranged apart along a laser scan line 161a according to an embodiment of the present disclosure.

As depicted in the example of FIG. 4, the first and third optical slits 210 and 230 may be used to determine the laser beam's position. As the laser beam 30 is scanned from the left to right along the laser scan line 161a, the first and third electrical pulses 310 and 330 may be obtained through the first and third optical slits 210 and 230, respectively. For example, the first electrical pulse 310 may correspond to a pulse detected at a first position 211 on the laser scan line 161*a*, and the third electrical pulse 330 may correspond to a pulse detected at a third position 231 on the laser scan line 161*a*. The first position 211 may also correspond to a position of the first optical slit 210 where the laser beam 30 is picked up. The third position 231 may correspond to a position of the second optical slit 220 where the laser beam 30 is picked up. A distance D between the two positions 211 and 231 may be determined by multiplying a laser scan speed SP with a time difference T between the two pulses 310 and 330 as given by Equation 2.

Distance $D$=Scan speed $SP$×Time difference $T$  (Equation 2)

Figures 5A, 5B:
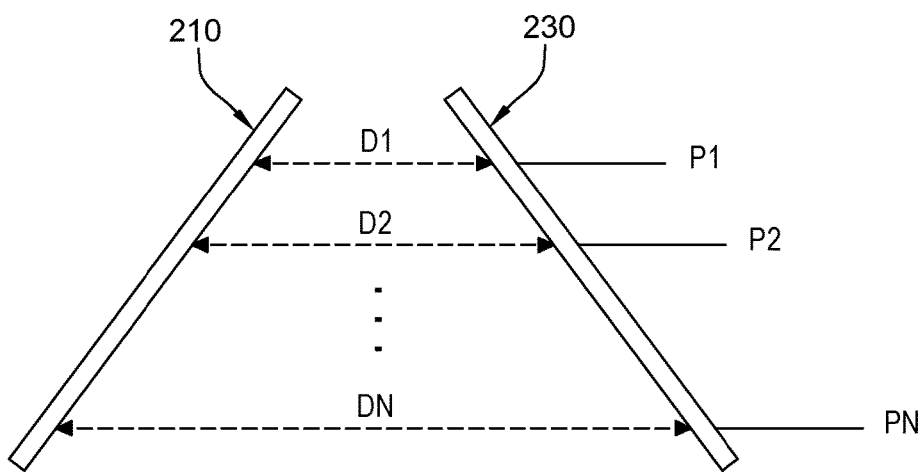
FIGS. 5A and 5B are schematic diagrams illustrating a method for determining a laser beam' position using two optical slits according to an exemplary embodiment of the present disclosure.

It should be noted that as the first and third optical slits 210 and 230 extend in different directions (e.g., longitudinal directions of the optical slits 210 and 230 are not parallel to each other), there is an one-to-one correspondence between a vertical position P of the laser scan line 161*a* and a corresponding distance D between the optical slits 210 and 230, as shown in FIGS. 5A and 5B. As depicted in the example of FIGS. 5A and 5B, when the distance D between the two optical slits 210 and 230 is D1, the laser scan line 161*a* along which the laser beam 30 is scanned may be determined to be at a position P1 (in height) in the vertical direction. Similarly, when the distance D is D2 (or DN), the laser scan line 161*a* may be determined to be at a position P2 (or PN) in the vertical direction. As shown in Equation 2, based on a particular time difference T between the two electrical pulses 310 and 330, a corresponding distance D between the optical slits 210 and 230 can be determined. Further, based on the distance D between the optical slits 210 and 230, a corresponding position P in the vertical direction of the laser beam 30 may be determined. The example relationship information among a time difference T between two pulses 310 and 330 obtained, respectively, through the optical slits 210 and 230, a distance D between the optical slits 210 and 230, and a corresponding position P of the laser beam 30 in a vertical direction are shown in FIG. 5B. The example relationship information may be stored in a memory (not shown). For example, the time difference T between the two pulses 310 and 330 may be measured using the measurement setup 190 of FIG. 1, and the computer system 180 of FIG. 1 may calculate the distance D between the first and third optical slits 210 and 230 (e.g., the first position 211 and the third position 231) and may look up the relationship information from the memory to determine the corresponding position P of the scan laser beam 30 in the vertical direction. In this case, the laser beam sensor 20*a*, the measurement setup 190, a partial portion of the computer system 180, and a partial portion of the controller 170 may constitute a laser beam sensing system according to an embodiment of the present disclosure. The laser beam sensing system may determine whether there is a vertical offset between a laser scan pattern and the wafer-set region 165, and determine an amount of the vertical offset (if any) by comparing a determined vertical position P of a particular laser scan line (or a laser beam) with a desired (or intended) vertical position.

In one embodiment, each of the laser beam sensors 20_1 and 20_2 of FIG. 2 may have the same configuration as the laser beam sensor 20*a* and may be used to determine the laser beam's position in a y axis when the laser beam is scanned along an x axis. In this case, the horizontal direction (e.g., corresponding to the laser scan line 161*a*) of FIG. 3B may correspond to the x axis of FIG. 2, and the vertical direction (e.g., perpendicular to the laser scan line 161*a*) of FIG. 3B may correspond to the y axis of FIG. 2. On the other hand, each of the laser beam sensors 20_3 and 20_4 of FIG. 2 may have the same configuration as the laser beam sensor 20*a* and may be used to determine the laser beam's position in the x axis when the laser beam is scanned along the y axis. In this case, the horizontal direction and the vertical direction shown in FIG. 3B may correspond to the y and x axes, respectively. For example, referring to FIG. 2, the laser beam sensors 20_1 and 20_2 may be used to determine a y axis offset of the scan laser beam from a y axis desired position, and the laser beam sensors 20_3 and 20_4 may be used to determine a x axis offset of the scan laser beam from a x axis desired position. The controller 170 may control the optical scanner 131 to calibrate the position of the scan laser beam based on the x axis offset and the y axis offset. After the entire portions of a wafer (e.g., 150) are fully scanned using a laser beam for debonding, the laser beam may be projected with a circular (or elliptical) edge scan pattern to deliver a high ablation dose near the edge of the wafer. Releasing of the adhesive at the wafer's edge may be difficult because the adhesive wicks up the Si/glass edge bevels. Thus, a precise alignment of the laser beam to the wafer's edge is required. The beam sensing system according to an embodiment allows to determine the laser beam's position to within a fraction (e.g., 100 μm or better) of the laser beam's spot size or even better. In another example application, the beam sensing system according to an embodiment can be used to selectively release dies on some locations (e.g., a particular row) of a wafer, leaving other dies on other locations (e.g., a adjacent row to the particular row) thereof.

Figure 6A:
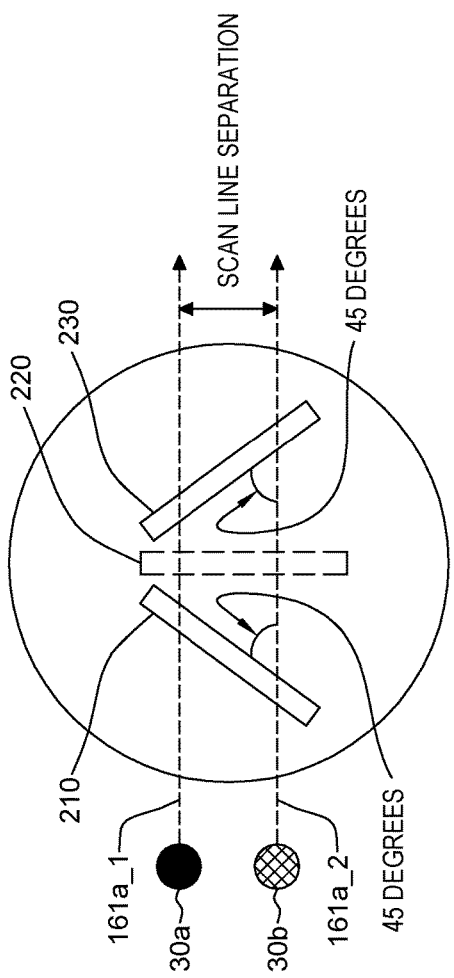
FIGS. 6A to 6C are schematic diagrams illustrating a method for determining a laser beam' position using two optical slits according to an exemplary embodiment of the present disclosure.
Figure 6B:
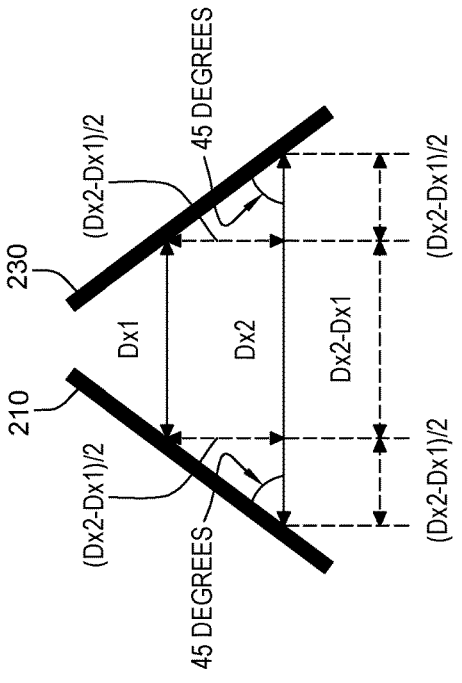
Figure 6C:
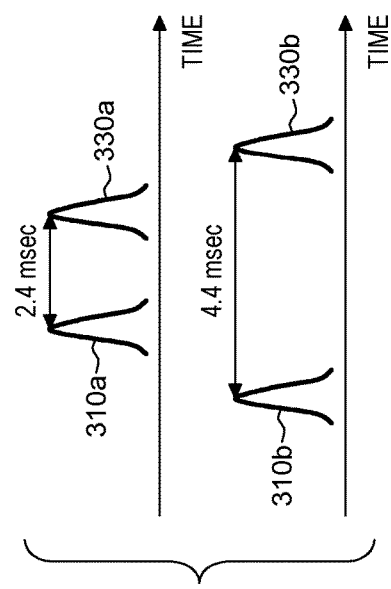

In some embodiments for determining the laser beam's position, each of the first optical slit 210 and the third optical slit 230 of the laser beam sensor 20*a* may be angled by 45 degrees with respect to a laser scan line (e.g., 161*a*_1 or 161*a*_2), as depicted in FIG. 6A. In this particular embodiment, a separation between adjacent laser scan lines 161*a*_1 and 161*a*_2 can be determined. If the laser beam sensor 20*a* is used only for determining the laser beam's position, the second optical slit 220 might not be included in the laser beam sensor 20*a*. Thus, for example, the laser beam sensor 20*a* is redrawn to illustrate on how to determine the separation between the adjacent laser scan lines 161*a*_1 and 161*a*_2, as shown in FIG. 6B. The distance Dx1 may be a distance between the first and third optical slits 210 and 230 when a laser beam 30*a* is scanned along the laser scan line 161*a*_1, and the distance Dx2 may be a distance between the first and third optical slits 210 and 230 when a laser beam 30*b* is scanned along the laser scan line 161*a*_2. A difference between the distances Dx1 and Dx2 may be calculated to be "Dx2−Dx1", as shown in FIG. 6B. Given that each of the first and third optical slits 210 and 230 is 45 degree angled, the distance (i.e., separation) between the adjacent scan lines 161*a*_1 and 161*a*_2 may be determined to be "(Dx2−Dx1)/2)". For example, as exemplary shown in FIG. 6C, if we assume that: the laser scan speed is 1000 mm/sec; a time difference between two electrical pulses 310*a* and 330*a* obtained when the laser beam 30*a* is scanned along the scan line 161*a*_1 is measured to be 2.4 msec; a time difference between two electrical pulses 310*b* and 330*b* obtained when the laser beam 30*b* is scanned along the scan line 161*a*_2 is measured to be 4.4 msec, the distance Dx1 may be determined to be 2.4 mm (e.g., 1000 mm/sec (laser scan speed)× 2.4 msec (time difference)) and the distance Dx2 may be determined to be 4.4 mm. Thus, the distance Dx2−Dx1 between the first and third optical slits 210 and 230 may be 2 mm, and the separation between the laser scan lines 161a_1 and 161a_2 will be determined to be 1 mm.

Figure 7:
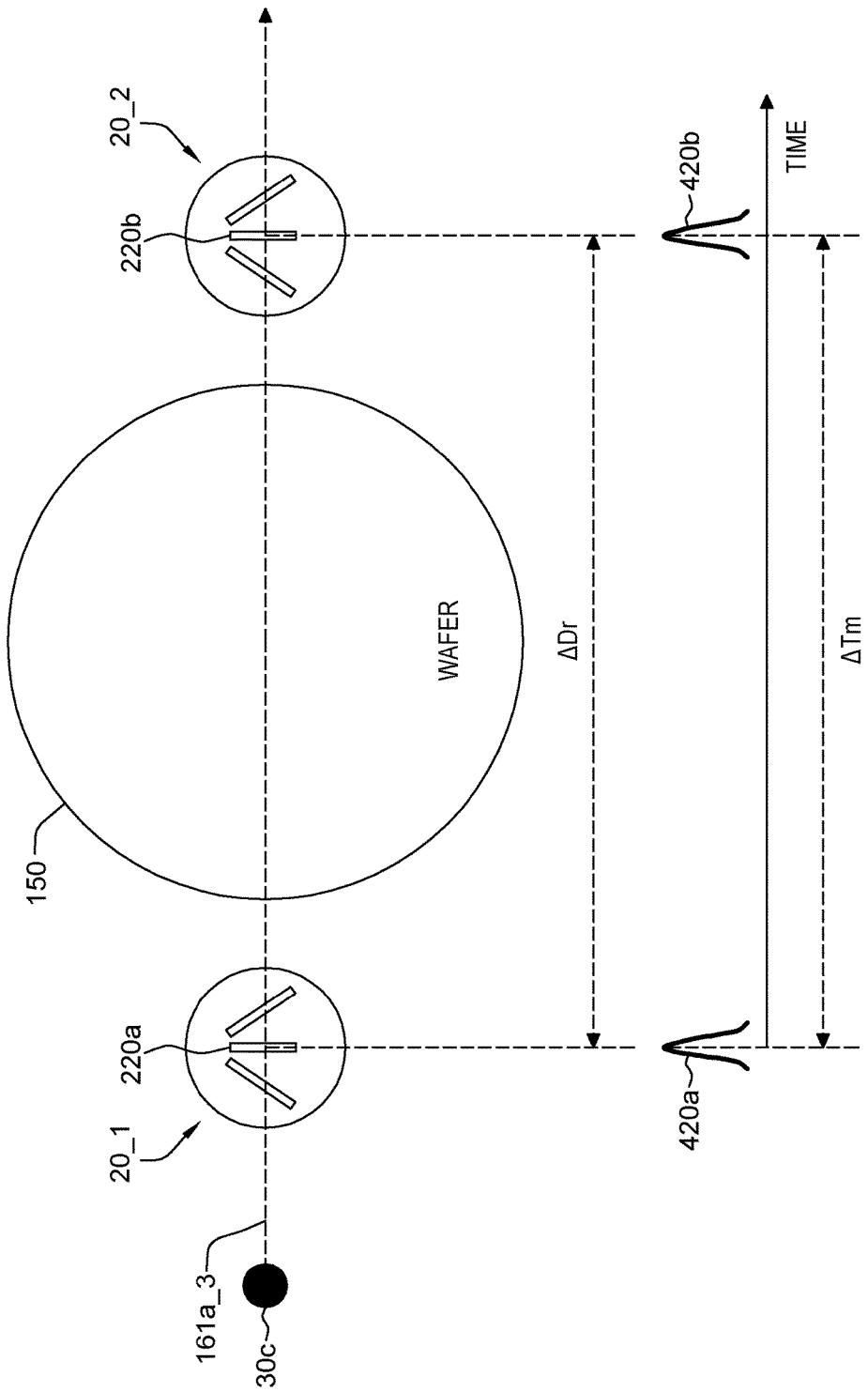
FIG. 7 is a schematic diagram illustrating a method for determining a scan magnification according to an embodiment of the present disclosure.

FIG. 7 is a schematic diagram illustrating a method for determining a scan magnification according to an embodiment of the present disclosure.

As depicted in the example of FIG. 7, a pair of two laser beam sensors 20_1 and 20_2 (or 20_3 and 20_4 of FIG. 2) may be used to determine whether a scan magnification of the laser scanning system 10 has a desired value. For example, a laser scan speed and a time for a laser beam to traverse across two optical slits separated by a known distance may be used to determine the scan magnification.

For example, a pair of two laser beam sensors 20_1 and 20_2 are placed adjacent to both opposing edges of a wafer 150, and if a laser beam 30c is scanned across the laser beam sensors 20_1 and 20_2 along the laser scan line 161a_3, a second optical slit 220a of the laser beam sensor 20_1 and a second optical slit 220b of the laser beam sensor 20_2 may provide two electrical pulses 420a and 420b, respectively, with a time difference ΔTm. In one embodiment, a distance ΔDr between the optical slits 220a and 220b may be known to the laser beam sensing system (e.g., computer system 180 of FIG. 1).

Referring back to FIG. 1, a distance between the scan lens 140 and the surface of the wafer 150 may be adjusted to obtain a desired scan magnification and to focus the laser beam on the wafer. The term "scan magnification" may refer to a ratio of a scan length that the laser beam travels on the wafer 150 to an amount of rotation of each mirror 131 and 132. For example, as the distance between the scan lens 140 and the surface of the wafer 15 is increased, the scan length given by a certain amount of rotation of each mirror 131 and 132 may be increased and the time difference ΔTm between the electrical pulses 420a and 420b may be decreased. As the distance between the scan lens 140 and the surface of the wafer 150 is decreased, the scan length given by a certain amount of rotation of each mirror 131 and 132 may be decreased and the time difference ΔTm between the electrical pulses 420a and 420b may be increased. The desired (or correct) scan magnification may be found when the time difference ΔTm between the electrical pulses 420a and 420b is matched with a result (e.g., a time value) of dividing the known distance ΔDr between the optical slits 220a and 220b by the laser scan speed SP (e.g., ΔDr/SP). For example, the distance between the scan lens 140 and the surface of the wafer 150 may be adjusted such that the time difference ΔTm is matched with the result of dividing the known distance ΔDr by the laser scan speed SP, so that the laser scanning system 10 has a desired scan magnification value. If the time difference ΔTm is greater than the result of dividing the known distance ΔDr by the laser scan speed SP by a predetermined threshold, the distance between the scan lens 140 and the surface of the wafer 150 may be adjusted to be increased; or if the time difference ΔTm is smaller than the result of dividing the known distance ΔDr by the laser scan speed SP by the predetermined threshold, the distance between the scan lens 140 and the surface of the wafer 150 may be adjusted to be decreased, so that the scan magnification error can be compensated.

By way of example, if we assume that: the laser scan speed is 1000 mm/sec and the distance ΔDr between the two optical slits 220a and 220b is 300 mm, the distance between the scan lens 140 and the surface of the wafer 150 may be adjusted such that the time difference ΔTm between the electrical pulses 420a and 420b is matched with 0.3 sec.

Although the second optical slits 220a and 220b are used to provide two electrical pulses (e.g., 420a and 420b) whose time difference ΔTm is compared to the result of dividing the known distance ΔDr by the laser scan speed SP, embodiments of the present disclosure are not limited thereto. For example, other pairs of optical slits (e.g., 210a and 210b or 230a and 230b) can be used to replace the function of the optical slits 220a and 220b.

The time difference ΔTm between the electrical pulses 420a and 420b may be observed as the distance between the scan lens 140 and the surface of the wafer 150 is adjusted. If the time difference ΔTm is matched to the result of dividing the known distance ΔDr by the laser scan speed SP, it is determined that the scan magnification has been corrected (or the scan magnification error has been compensated).

An alternative approach may be used to compensate for scan magnification errors. Instead of adjusting the distance between the scan lens 140 and the wafer 150, the speed of the optical scanner 130's rotating mirrors 131 and 132 (e.g., galvos) may be changed to increase or decrease the scan speed, thereby correcting a scan magnification error. For example, the time difference ΔTm between the electrical pulses 420a and 420b may be observed as the speed of the optical scanner 130's rotating mirrors 131 and 132 (e.g., galvos) may be changed. If the time difference ΔTm is matched to the result of dividing the known distance ΔDr by the laser scan speed SP, it is determined that the scan magnification has been corrected (or the scan magnification error has been compensated).

In another embodiment, the speed of the optical scanner 130's rotating mirrors 131 and 132 (e.g., glavo) may be held constant and the on/off timing of the laser beam may be adjusted so the laser beam exposes a desired region of the wafer 150. This method uses the laser beam sensors (located in a known position to relative to the wafer 150) to measure the laser beam position, scan magnification and time to traverse a known distance between the laser beam sensors (e.g., 210 and 230 of FIG. 6A; or 210a and 210b of FIG. 7). The positions sensors are at a known position relative to the wafer 150. This information is used to precisely control on/off timing of the laser beam so that the desired region of the wafer 150 is exposed by the laser beam.

If at least one of the laser beam's spot size and position, and the scan magnification is determined, the computer system 180 may determine whether a calibration is required for each of the spot size, position, and scan magnification by comparing each of the determined values with a corresponding desired value which may be predetermined and stored in a memory. In one embodiment, if a particular one of the spot size, position, and scan magnification has a value out of a predetermined range from the corresponding desired value, the computer system 180 may determine the particular one of the spot size, position, and scan magnification as a parameter requiring a calibration and may control corresponding parts of the laser scanning system 10 via the controller 170 for calibration. For example, the position of the scan lens 140 may be adjusted for calibration of the laser beam's spot size. The positions (e.g., angle of each rotating mirror) of the rotating mirrors 131 and 132 of the optical scanner 130 may be adjusted for calibration of the laser beam's position. In addition, the distance between the scan lens 140 and the surface of the wafer 150 may be adjusted to obtain a desired scan magnification.

Next, the calibrated laser beam can be used for a wafer debonding process including ablating a majority of adhesives by scanning the calibrated laser beam over the entire wafer and ablating remaining adhesives by precisely scanning the calibrated laser beam over the wafer's edge.

Figure 8:
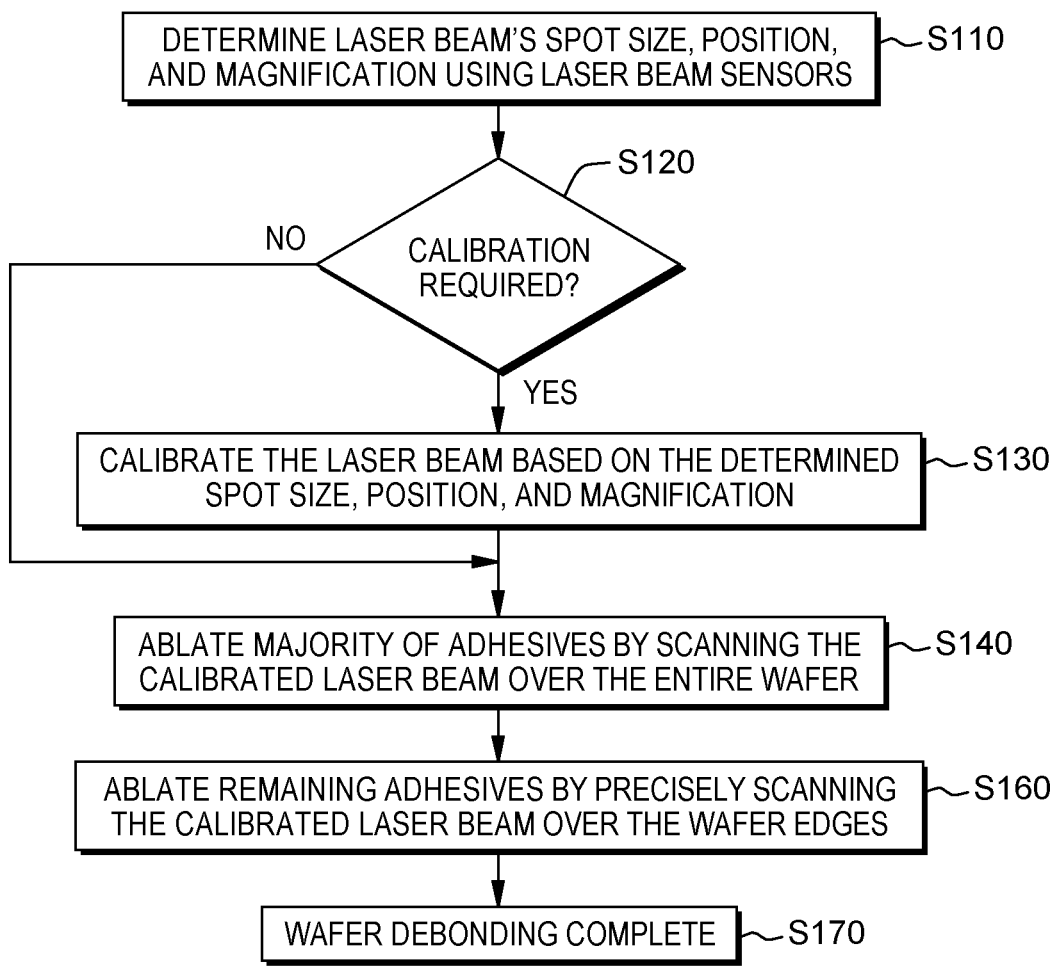
FIG. 8 is a flow chart depicting an example method for debonding a wafer using a laser beam sensing system according to an embodiment of the present disclosure.
Figure 9:
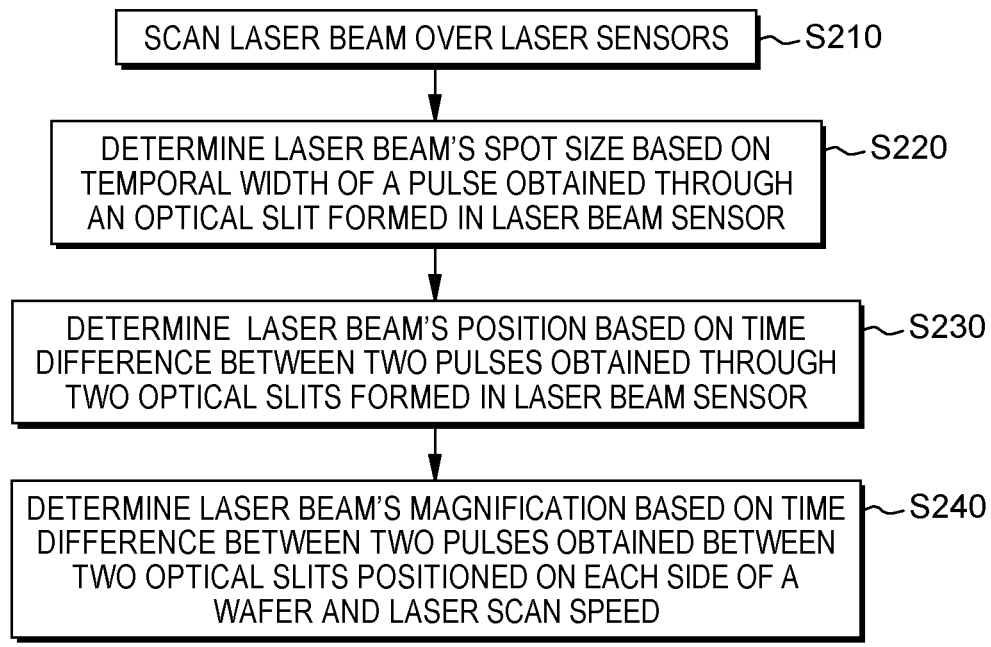
FIG. 9 is an example flow chart depicting details of the step S110 of FIG. 8 according to an embodiment of the present disclosure.

FIG. 8 is a flow chart depicting an example method for debonding a wafer using a laser beam sensing system according to an embodiment of the present disclosure. FIG. 9 is an example flow chart depicting details of the step S110 of FIG. 8 according to an embodiment of the present disclosure.

Referring to the examples depicted in FIGS. 1, 2, 3A to 3D, 4, 5A, 5B, 7, and 8, the method may include steps S110 to S170.

At S110, the laser beam's spot size and the position, the scan magnification provided by a laser scanning system (e.g., 10 of FIG. 1) may be determined using one or more laser beam sensors (e.g., 20_1 to 20_4 of FIG. 2). Next, it may be determined whether a calibration for at least one of the laser beam's spot size and position, and the scan magnification is needed (S120). In one embodiment, each of the determined laser beam's spot size and position, and the scan magnification may be compared to a desired value. If the determined value(s) is different than a corresponding desired value by a predetermined threshold, the calibration for the corresponding parameter may be required. If the calibration is determined to be required (YES) in the step S120, the laser beam may be calibrated by adjusting the spot size and the position, and the scan magnification according to the determined values (S130). Next, at S140, a majority of adhesives attached to a wafer (e.g., 150) may be ablated (or released) by scanning the calibrated laser beam over the entire portion of the wafer. In the step S120, if it is determined that no calibration is required (NO), the method may go to the step S140. Next, the adhesives remaining around edges of the wafer may be ablated by precisely scanning the calibrated laser beam over the wafer edges (S160). At 170, the wafer debonding may be completed.

Referring to the example depicted in FIGS. 1, 2, 3A to 3D, 4, 5A, 5B, and 7, and 9, the step S110 may include steps S210 to S250.

To determine the laser beam's spot size and position, and the scan magnification, a laser beam provided by the laser scanning system (e.g., 10) may be scanned over the one or more laser beam sensors (e.g., 20_1 to 20_4) (S210).

At S220, the laser beam's spot size may be determined based on a temporal width of a pulse (e.g., 320 of FIG. 3D) obtained through an optical slit (e.g., 220 of FIG. 3B) formed in at least one of the laser beam sensors. The optical slit (e.g., 220) may be formed such that its longitudinal direction is substantially perpendicular to a laser scan line (e.g., 161*a* of FIG. 3B). The laser beam's spot size may be determined by calculating a multiplication of the laser beam scan speed along the laser scan line (e.g., 161*a*) and the temporal width (e.g., FWHM) of the pulse (e.g., 320) obtained through the optical slit (e.g., 220).

At S230, the laser beam's position may be determined based on a time difference between two pulses (e.g., 310 and 330 of FIG. 4) obtained, respectively, through two optical slits (e.g., 310 and 330) formed in at least one of the laser beam sensors. The time difference between the two pulses (e.g., 310 and 330) may be multiplied with a laser scan speed along the laser scan line (e.g., 161*a*) to determine a distance between the optical slits (e.g., 210 and 230). Next, the distance between the optical slits may be used to determine a corresponding position of the laser beam in a vertical direction, and the determined position of the laser beam in the vertical direction may be compared with a desired position to determine whether there is a vertical offset between a laser scan pattern and a wafer-set region (e.g., 165).

At S240, it may be determined whether the scan magnification is correct based on a time difference between two pulses (e.g., 420*a* and 420*b* of FIG. 7) obtained, respectively, through two optical slits (e.g., 220*a* and 220*b* of FIG. 7) and a laser scan speed. The above two optical slits may be positioned adjacent to two opposing edges of a wafer (e.g., 150).

Figure 10:
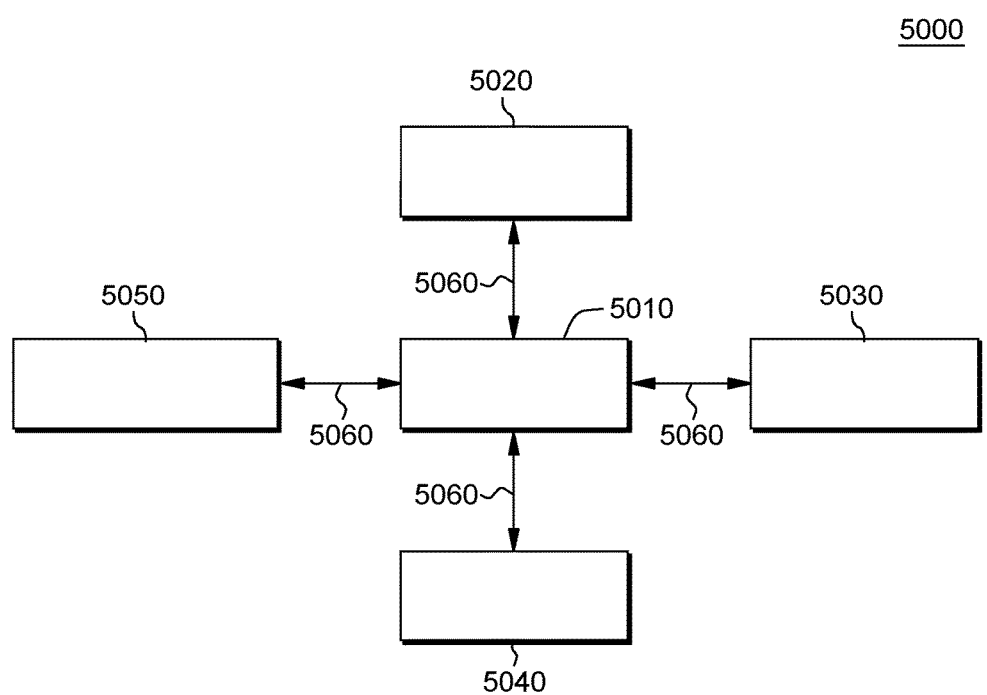
FIG. 10 is a block diagram of a computing system according to an embodiment of the present invention.

FIG. 10 is a block diagram of a computing system 5000 according to an exemplary embodiment of the present disclosure.

Referring to FIG. 10, the computing system 5000 may be used as a platform for performing (or controlling) the functions or operations described hereinabove with respect to the wafer debonding apparatus 1 of FIG. 1 and the methods of FIGS. 8 and 9.

In addition, the computing system 5000 may be implemented with an UMPC, a net-book, a PDA, a portable computer (PC), a web tablet, a wireless phone, a mobile phone, a smart phone, an e-book, a PMP, a portable game console, a navigation device, a black box, a digital camera, a DMB player, a digital audio recorder, a digital audio player, a digital picture recorder, a digital picture player, a digital video recorder, a digital video player, or the like.

Referring to FIG. 10, the computing system 5000 may include a processor 5010, I/O devices 5020, a memory system 5030, a display device 5040, and a network adaptor 5050.

The processor 5010 may drive the I/O devices 5020, the memory system 5030, the display device 5040, and the network adaptor 5050 through a bus 5060.

The computing system 5000 may include a program module (not shown) for performing (or controlling) the functions or operations described hereinabove with respect to the wafer debonding apparatus 1 of FIG. 1 and the methods of FIGS. 8 and 9 according to exemplary embodiments. For example, the program module may include routines, programs, objects, components, logic, data structures, or the like, for performing particular tasks or implement particular abstract data types. The processor (e.g., 5010) of the computing system 5000 may execute instructions written in the program module to perform (or control) the functions or operations described hereinabove with respect to the wafer debonding apparatus 1 of FIG. 1 and the methods of FIGS. 8 and 9. The program module may be programmed into the integrated circuits of the processor (e.g., 5010). In an exemplary embodiment, the program module may be stored in the memory system (e.g., 5030) or in a remote computer system storage media.

The computing system 5000 may include a variety of computing system readable media. Such media may be any available media that is accessible by the computer system (e.g., 5000), and it may include both volatile and non-volatile media, removable and non-removable media.

The memory system (e.g., 5030) can include computer system readable media in the form of volatile memory, such as random access memory (RAM) and/or cache memory or others. The computer system (e.g., 5000) may further include other removable/non-removable, volatile/non-volatile computer system storage media.

The computer system (e.g., 5000) can communicate with one or more devices using the network adapter (e.g., 5050). The network adapter may support wired communications based on Internet, LAN, WAN, or the like, or wireless communications based on CDMA, GSM, wideband CDMA, CDMA-2000, TDMA, LTE, wireless LAN, Bluetooth, or the like.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., laser pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++ or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present disclosure has been presented for purposes of illustration and description, but is not intended to be exhaustive or limited to the present disclosure in the form disclosed. Many modifications and variations will be apparent to those of ordinary skill in the art without departing from the scope and spirit of the present disclosure. The embodiment was chosen and described in order to best explain the principles of the present disclosure and the practical application, and to enable others of ordinary skill in the art to understand the present disclosure for various embodiments with various modifications as are suited to the particular use contemplated.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A laser beam sensing system comprising one or more laser beam sensors located outside a wafer and at least one processor,
    wherein at least one laser beam sensor of the laser beam sensors comprises, the at least one laser beam sensor being adjacent to one of opposing edges of the wafer:
        a first optical slit configured to pick up, at a first position of a laser scan line, a scan laser beam generated from a laser scanning system and guide the laser beam to a photodetector;
        a second optical slit configured to pick up, at a second position of the laser scan line, the scan laser beam and guide the laser beam to the photodetector;
        a third optical slit configured to pick up, at a third position of the laser scan line, the scan laser beam and guide the laser beam to the photodetector; and
        the photodetector configured to convert the laser beam guided through the first to third optical slits to first to third electrical pulses, respectively,
    wherein the at least one processor is configured to determine a spot size of the laser beam based on a laser scan speed and a temporal width of the first electrical pulse and determine a position of the scan laser beam based on a time difference between the second and third electrical pulses, and
    wherein positions of the second optical slit and the third optical slit relative to the wafer are known to the at least one processor.

2. The laser beam sensing system of claim 1, wherein the first optical slit is positioned between the second optical slit and the third optical slit.

3. The laser beam sensing system of claim 1, wherein each of the first to third optical slits is formed along a same plane as a top surface of the wafer.

4. The laser beam sensing system of claim 1, wherein the first optical slit has a first longitudinal direction substantially perpendicular to the laser scan line, and
    wherein the second optical slit has a second longitudinal direction oblique to the laser scan line, the third optical slit has a third longitudinal direction oblique to the laser scan line, and the second and third optical slits form a V-shape with respect to the first optical slit.

5. The laser beam sensing system of claim 1, wherein the at least one processor is configured to calibrate the laser scanning system based on the determined position of the scan laser beam.

6. The laser beam sensing system of claim 1, further comprising another laser beam sensor adjacent to another of the opposing edges of the wafer, said another laser beam sensor having a fourth optical slit configured to pick up, at a fourth position of the laser scan line, the scan laser beam and guide the laser beam to the photodetector,
    wherein the photodetector is configured to convert the laser beam guided through the fourth optical slit to a fourth electrical pulse,
    wherein the at least one processor is configured to determine whether a scan magnification of the laser scanning system is correct based on the time difference between the first electrical pulse and the fourth electrical pulse, the laser scan speed, and a predetermined distance between the first optical slit and the fourth optical slit.

7. The laser beam sensing system of claim 6, wherein responsive to determining that the scan magnification is not correct, the at least one processor is configured to adjust at least one of: a distance between a scan lens of the laser scanning system and the wafer; and on/off timing of the scan laser beam.

8. A wafer debonding apparatus, comprising:
    a laser scanning system configured to provide a scan laser beam;
    a laser beam sensing system located outside a wafer for aligning the scan laser beam on the wafer,
    wherein at least one laser beam sensor of the laser beam sensing system comprises, the at least one laser beam sensor being adjacent to one of opposing edges of the wafer:
        a first optical slit configured to pick up, at a first position of a laser scan line, the scan laser beam and guide the laser beam to a photodetector;
        a second optical slit configured to pick up, at a second position of the laser scan line, the scan laser beam and guide the laser beam to the photodetector;
        a third optical slit configured to pick up, at a third position of the laser scan line, the scan laser beam and guide the laser beam to the photodetector;
        the photodetector configured to convert the laser beam guided through the first to third optical slits to first to third electrical pulses, respectively; and
        at least one processor configured to determine a spot size of the scan laser beam based on a laser scan speed and a temporal width of the first electrical pulse and determine a position of the scan laser beam based on a time difference between the second and third electrical pulses, and
    wherein positions of the second optical slit and the third optical slit relative to the wafer are known to the at least one processor.

9. The wafer debonding apparatus of claim 8, further comprising another laser beam sensor adjacent to another of the opposing edges of the wafer, said another laser beam sensor having a fourth optical slit configured to pick up, at a fourth position of the laser scan line, the scan laser beam and guide the laser beam to the photodetector, wherein the photodetector is configured to convert the laser beam guided through the fourth optical slit to a fourth electrical pulse, wherein the at least one processor is configured to determine whether a scan magnification of the laser scanning system is correct based on the time difference between the first electrical pulse and the fourth electrical pulse, the laser scan speed, and a predetermined distance between the first optical slit and the fourth optical slit.

10. The wafer debonding apparatus of claim 8, wherein responsive to determining that the scan magnification is not correct, the at least one processor is configured to adjust at least one of: a distance between a scan lens of the laser scanning system and the wafer; and on/off timing of the scan laser beam.

11. The wafer debonding apparatus of claim 8, wherein each of the first to third optical slits is formed along a same plane as a top surface of the wafer.

12. The wafer debonding apparatus of claim 8, wherein the first optical slit has a first longitudinal direction substantially perpendicular to the laser scan line, and wherein the second optical slit has a second longitudinal direction oblique to the laser scan line, the third optical slit has a third longitudinal direction oblique to the laser scan line, and the second and third optical slits form a V-shape with respect to the first optical slit.

13. The wafer debonding apparatus of claim 8, wherein the at least one processor is configured to calibrate the laser scanning system based on the determined position of the scan laser beam.

\* \* \* \* \*